United States Patent
Farmer et al.

(10) Patent No.: US 9,954,176 B1
(45) Date of Patent: Apr. 24, 2018

(54) DIELECTRIC TREATMENTS FOR CARBON NANOTUBE DEVICES

(71) Applicant: International Business Machines Corporation, Armonk, NY (US)

(72) Inventors: Damon B. Farmer, White Plains, NY (US); Martin M. Frank, Dobbs Ferry, NY (US); Shu-Jen Han, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/287,342

(22) Filed: Oct. 6, 2016

(51) Int. Cl.
| H01L 29/06 | (2006.01) |
| H01L 29/08 | (2006.01) |
| H01L 51/00 | (2006.01) |
| H01L 51/05 | (2006.01) |

(52) U.S. Cl.
CPC ...... H01L 51/0048 (2013.01); H01L 29/0673 (2013.01); H01L 51/0017 (2013.01); H01L 51/0026 (2013.01); H01L 51/0558 (2013.01)

(58) Field of Classification Search
None
See application file for complete search history.

(56) References Cited

U.S. PATENT DOCUMENTS

| 7,253,431 B2 | 8/2007 | Afzali-Ardakani et al. |
| 2005/0186806 A1 | 8/2005 | Shin |
| 2006/0035450 A1* | 2/2006 | Frank ............... H01L 21/76254 438/585 |
| 2007/0215224 A1* | 9/2007 | Furukawa ............ F04B 43/043 137/833 |
| 2009/0166686 A1* | 7/2009 | Hunt ..................... B82Y 10/00 257/288 |
| 2010/0018550 A1* | 1/2010 | Schwartzkopf ...... C11D 3/0073 134/2 |
| 2013/0025662 A1 | 1/2013 | Afzali-Ardakani et al. |
| 2015/0340631 A1* | 11/2015 | Rinzler ............... H01L 29/7395 257/40 |

FOREIGN PATENT DOCUMENTS

| CN | 104810263 A | 7/2015 |
| CN | 105448657 A | 3/2016 |
| DE | 2802048 A1 | 7/1978 |

OTHER PUBLICATIONS

Cao et al., "Origins and Characteristics of the Threshold Voltage Variability of Quasiballistic Single-Walled Carbon Nanotube Field-Effect Transistors," ACS Nano 9, pp. 1936-1944 (Feb. 2015).

(Continued)

*Primary Examiner* — Calvin Choi
(74) *Attorney, Agent, or Firm* — Vazken Alexanian; Michael J. Chang, LLC

(57) ABSTRACT

Dielectric treatments for carbon nanotube devices are provided. In one aspect, a method for forming a carbon nanotube-based device is provided. The method includes: providing at least one carbon nanotube disposed on a first dielectric; removing contaminants from surfaces of the first dielectric; and depositing a second dielectric onto the first dielectric and at least partially surrounding the at least one carbon nanotube. A carbon nanotube-based device is also provided.

20 Claims, 6 Drawing Sheets

(56) References Cited

OTHER PUBLICATIONS

J. Lu et al., "Growth of horizontally aligned dense carbon nanotubes from trench sidewalls," Nanotechnology 22, pp. 1-6 (May 2011).
Cao et al., "Wafer-Level Hysteresis-Free Resonant Carbon Nanotube Transistors", ACS nano, 9(3), pp. 2836-2842 (Mar. 2015).
Lefebvre, "Hysteresis free carbon nanotube thin film transistors comprising hydrophobic dielectrics", Applied Physics Letters, 107(24), pp. 243301-1 to 4, (Dec. 2015).
Liu et al., "Improving non-suspended carbon nanotube FET performance by using an alumina protective layer" Sensors and Actuators B: Chemical, 198, pp. 479-486 (Mar. 2014).
Lin et al., "Impact of oxide substrate on electrical and optical properties of carbon nanotube devices". Nanotechnology, 18(29), pp. 295202-1 to 6 (Jun. 2007).
English Translation of DE2802048A1 by Chan Tsiu Chiu et al., Jul. 27, 1978 (14 pages).
English Translation of CN105448657A by Hao Long et al., Mar. 30, 2016 (7 pages). 1.
English Translation of CN104810263A by Wen Zhengfeng et al., Jul. 29, 2015 (8 pages).

\* cited by examiner

DIELECTRIC TREATMENTS FOR CARBON NANOTUBE DEVICES

FIELD OF THE INVENTION

The present invention relates to carbon nanotube (CNT) devices, and more particularly, to dielectric treatments for CNT devices.

BACKGROUND OF THE INVENTION

Based on their unique properties, carbon nanotubes (CNT) are being investigated for use in a variety of fields such as in electronics, displays, photovoltaics, and energy storage. One particularly beneficial application would be in field-effect transistors (FETs) for future complementary metal oxide semiconductor (CMOS) logic technology nodes.

Circuits including CNT-based FETs often exhibit high threshold voltage (Vt) variability, rendering them useless for practical use. Given the known sensitivity of CNTs to individual electrical charges or dipoles nearby, this variability may be due to randomly distributed charges or dipoles at material surfaces or interfaces near the CNT. See, for example, Cao et al., "Origins and Characteristics of the Threshold Voltage Variability of Quasiballistic Single-Walled Carbon Nanotube Field-Effect Transistors," ACS Nano 9, pgs. 1936-1944 (February 2015).

Therefore, techniques for minimizing electrical disturbances of the CNTs in these devices would be desirable.

SUMMARY OF THE INVENTION

The present invention provides dielectric treatments for carbon nanotube devices. In one aspect of the invention, a method for forming a carbon nanotube-based device is provided. The method includes: providing at least one carbon nanotube disposed on a first dielectric; removing contaminants from surfaces of the first dielectric; and depositing a second dielectric onto the first dielectric and at least partially surrounding the at least one carbon nanotube.

In another aspect of the invention, a carbon nanotube-based device is provided. The carbon nanotube-based device includes: a first dielectric; at least one carbon nanotube disposed on the first dielectric; a recess in the first dielectric beneath a center portion of the at least one carbon nanotube; a second dielectric disposed on the first dielectric, wherein the second dielectric fully surrounds the at least one carbon nanotube in the recess, and wherein an interface between the first dielectric and the second dielectric in the recess is separated from the at least one carbon nanotube by a distance d of from about 1 nanometer to about 5 nanometers, and ranges therebetween.

A more complete understanding of the present invention, as well as further features and advantages of the present invention, will be obtained by reference to the following detailed description and drawings.

DETAILED DESCRIPTION OF PREFERRED EMBODIMENTS

As described above, randomly distributed charges or dipoles at material surfaces or interfaces near carbon nanotubes (CNTs) result in high threshold voltage (Vt) variability in devices containing the CNTs. Advantageously, provided herein are techniques for minimizing the chemical species that generate these electronic disturbances. Such chemical species can include, but are not limited to, metals and organic species. This approach for minimizing chemical species near the CNTs broadly applies to a variety of applications including, but not limited to, CNT field-effect transistors (FETs), CNT interconnects, etc.

As will be described in detail below, after depositing a CNT(s) on a dielectric film, the dielectric film is modified (e.g., cleaned to remove adventitious contamination and/or to etch it back), and another dielectric film is deposited around/encapsulating at least a portion of the CNT(s). By removing the adventitious contamination, the cleaning removes charges and dipoles near the CNT(s). The etch back advantageously provides all-around access to the CNT(s) enabling full encapsulation, as well as it places the interface between the two dielectric films away from the CNT(s).

By way of example only, suitable dielectrics include, but are not limited to, silicon oxide ($SiO_2$), silicon nitride ($Si_3N_4$) and/or high-κ dielectrics such as aluminum oxide ($Al_2O_3$), hafnium oxide ($HfO_2$), zirconium oxide ($ZrO_2$), titanium oxide ($TiO_2$), lanthanum oxide ($La_2O_3$), and/or any combinations thereof. For instance, any mixture or multi-layer of these foregoing dielectrics may be used in accordance with the present techniques. The term "high-κ" as used herein refers to a material having a relative dielectric constant κ which is much higher than that of silicon dioxide (e.g., a dielectric constant κ=25 for $HfO_2$ rather than 4 for silicon dioxide).

Figure 1:
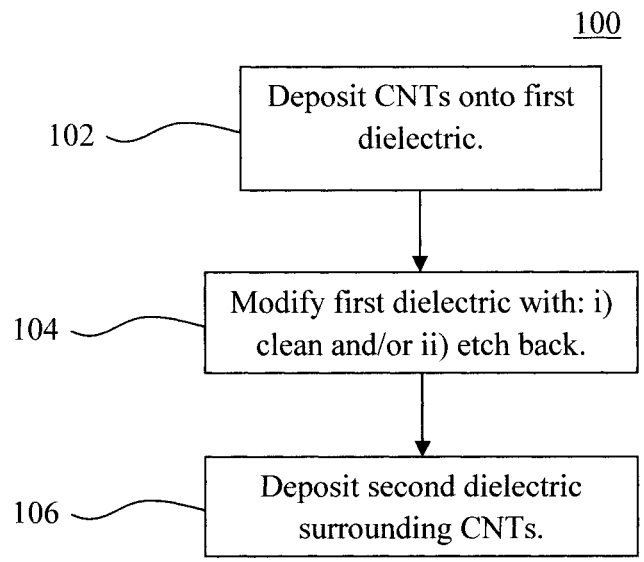
FIG. 1 is a diagram illustrating an exemplary methodology for forming a carbon nanotube (CNT)-based device according to an embodiment of the present invention.

An overview of the present techniques is now provided by way of reference to methodology 100 of FIG. 1. In step 102, at least one carbon nanotube (CNT) is deposited or in-situ grown on a first dielectric. CNTs are allotropes of carbon having a cylindrical nanostructure. The present techniques may be applied to applications involving a single CNT (such as a CNT-based transistor with a single CNT spanning a source and drain), or those having multiple aligned or randomly ordered (e.g., meshes) CNTs.

As provided above, suitable dielectrics for the first dielectric include, but are not limited to, $SiO_2$, $Si_3N_4$, $Al_2O_3$, $HfO_2$, $ZrO_2$, $TiO_2$, $La_2O_3$, and combinations thereof. As will be described in detail below, the first dielectric is preferably present on a substrate. The substrate can have a number of different configurations depending on the particular application at hand. For instance, the substrate might simply be a standard semiconductor substrate, such as a silicon (Si), germanium (Ge), silicon germanium (SiGe), etc. substrate on which the first dielectric layer is formed or deposited. By way of example only, a silicon-on-insulator or SOI wafer includes a SOI layer separated from a substrate by a buried insulator. When the insulator is an oxide, it is often referred to as a buried oxide or BOX. According to an exemplary embodiment, the BOX layer in a standard SOI wafer may serve as the first dielectric (from which the SOI layer has been removed).

According to another exemplary embodiment, the present techniques may be implemented in conjunction with a back-gated device configuration. In that case, the substrate or a portion thereof can be electrically conductive so as to serve as a back gate of the device. The first dielectric (on the substrate) would then serve as a gate dielectric separating the substrate/back gate from the CNT(s). In general, a field-effect transistor includes a source and a drain interconnected by a channel. The CNT(s) serve as the channel in a CNT-based FET. A gate(s) regulate current flow through the channel. The gate is often separated from the channel by a gate dielectric.

The present techniques are, however, not limited to any of the above applications. What is important is that a combination of dielectrics along with a cleaning process are used to encapsulate at least a portion of the CNTs thereby preventing electronic disturbances of the (sensitive) CNT(s). For instance, the present techniques may be employed (in the same manner described) to form CNT interconnects. In that case, the first dielectric might simply be an interlayer dielectric (ILD) in which interconnects (in this case CNT interconnects) are being formed.

By way of example only, the CNTs may be cast onto the first dielectric using a process such as spin coating from a solution. Solutions of CNTs are commercially available. The number of CNTs deposited onto the first dielectric (ranging, e.g., from a single CNT to multiple CNTs—i.e., a mesh) can be regulated in number of different ways. For example, with CNTs dispersed in a liquid media, additional liquid media can be added to the dispersion to decrease the number of CNTs deposited on a given surface area. If the dilution is great enough, then single CNT casting can be accomplished. Determining the correct dilution is within the capabilities of one skilled in the art. Alternatively, the CNTs can be cast onto the surface of the first dielectric through an opening in a mask. The opening is configured to permit only a certain number of CNTs to pass therethrough. For instance, the mask can be configured with an opening through which only a single CNT can pass.

Figure 11:
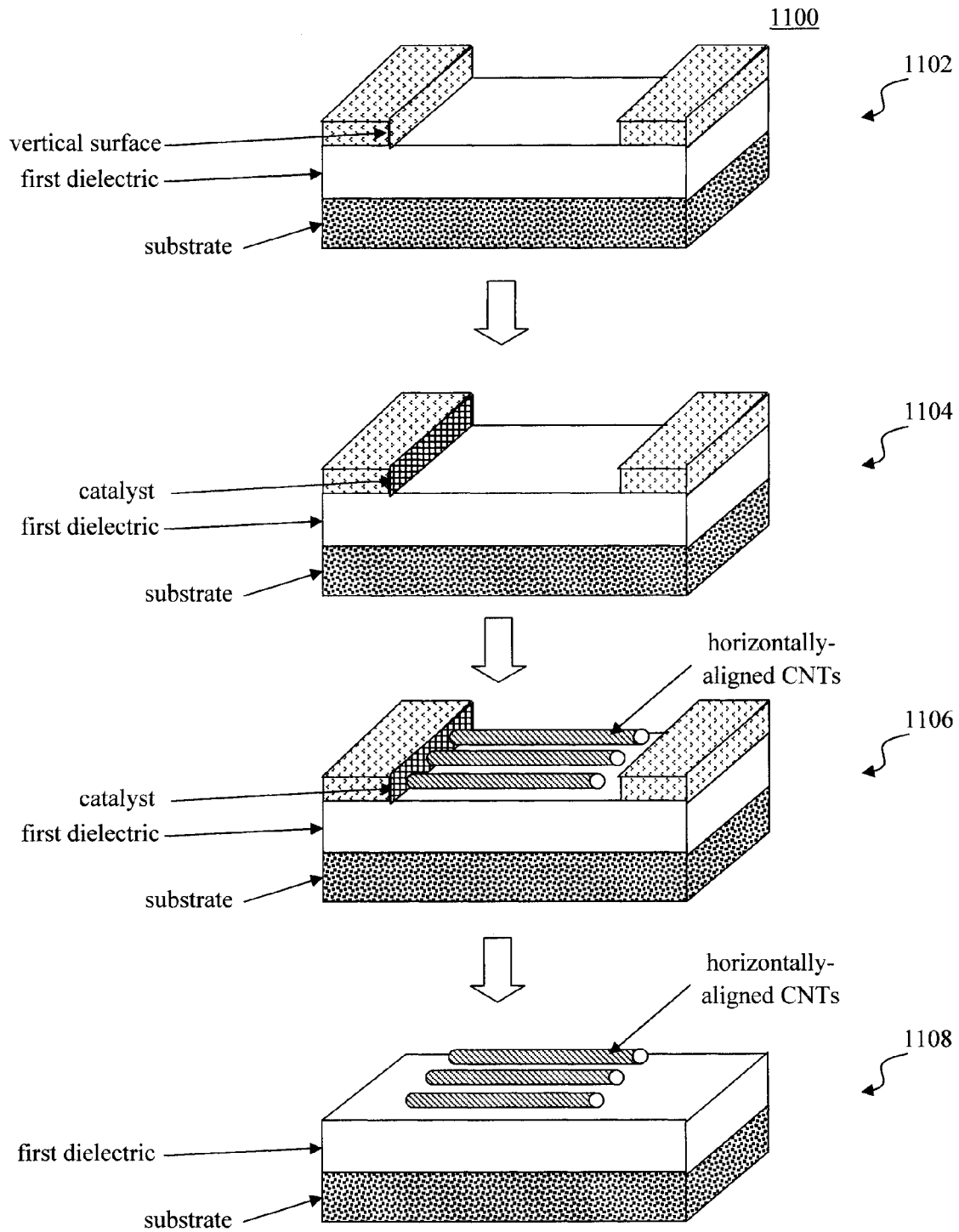
FIG. 11 is a diagram illustrating an exemplary methodology for in-situ growth of horizontally-aligned CNTs from a vertical surface according to an embodiment of the present invention.

Alternatively, the CNTs can be grown in place. For instance, lateral CNT growth can be performed (nucleated on a vertical sidewall). Lateral CNT growth is one way by which (horizontally) aligned CNTs can be achieved. See, for example, J. Lu et al., "Growth of horizontally aligned dense carbon nanotubes from trench sidewalls," Nanotechnology 22, pgs. 1-6 (May 2011) (hereinafter "Lu"), the contents of which are incorporated by reference as if fully set forth herein. An exemplary process for implementing in-situ grown horizontally-aligned CNTs in accordance with the present techniques is described in conjunction with the description of FIG. 11, below.

According to an exemplary embodiment, the CNTs are doped. In the case of a CNT-based FET, doping can be used to regulate the threshold voltage among other electrical parameters of the device. See, for example, U.S. Pat. No. 7,253,431 issued to Afzali-Ardakani et al., entitled "Method and Apparatus for Solution Processed Doping of Carbon Nanotube" (hereinafter "U.S. Pat. No. 7,253,431"), the contents of which are incorporated by reference as if fully set forth herein. U.S. Pat. No. 7,253,431 provides a suitable method for doping CNTs that can be used in accordance with the present techniques that employs a one-electron oxidant in a solution phase. Other suitable CNT doping techniques are described, for example, in U.S. Patent Application Publication Number 2013/0025662 by Afzali-Ardakani et al., entitled "Water Soluble Dopant for Carbon Films" (hereinafter "U.S. Patent Application Publication Number 2013/0025662"), the contents of which are incorporated by reference as if fully set forth herein. Dopants are described in U.S. Patent Application Publication Number 2013/0025662 that are used to tailor the electrical properties of the CNTs, such as lower their resistivity. The doping can be carried out in solution, i.e., the dopant can be added to the CNT dispersion prior to casting, and/or after the CNTs have been deposited.

Next, in step 104, the first dielectric is modified to i) clean the first dielectric (thereby removing contaminants from surfaces of the first dielectric that generate electronic disturbances for the CNTs) and, preferably, to also ii) etch back the first dielectric beneath a portion of the CNTs thereby permitting full encapsulation of at least a portion of the CNT(s) by a second dielectric (see below). The advantage to the etch back is that it places the interface between the first and second dielectric (remotely) away from the CNT(s). To illustrate this concept consider for instance the situation where, instead of etching back the first dielectric, the second dielectric is simply deposited onto the first dielectric covering the CNT(s). The interface between the first and second dielectric will be right at the top surface of the first dielectric, i.e., at the plane of the CNT(s). Randomly distributed charges at this interface are close to the CNT(s) and thus can affect performance.

During modification of the first dielectric, care must be taken to keep any damage of the (already deposited) CNT(s) to a minimum, for example, by employing one or more of the following cleaning/etching processes. In the following examples, wet clean processes for both contamination removal and for etch-back are presented, as are gas-phase or plasma processes for both contamination removal and for etch-back clean. An anneal in an inert environment is also described to desorb contaminants. It is notable that any combination of these processes can be used to modify the first dielectric. For example, a wet clean can be used for both contamination removal and for etch-back or, alternatively, a wet etch clean can be used for contamination removal followed by a gas-phase or plasma etch-back, or vice versa. Further, some steps may be performed in-situ depending on the cleaning/etch-back mechanism chosen. For instance, a gas-phase or plasma clean and/or etch-back can be performed in-situ along with deposition of the second dielectric.

As the description above provides, surface cleaning of the first dielectric can be performed with or without an accompanying etch back beneath the CNTs. According to an exemplary embodiment, both a surface cleaning and etch back are performed. In that case, since the etch back involves a mask (see, for example, FIG. 10—described below), the etch back is preferably performed prior to the surface clean. Thus, the clean/etch back process would be: mask-etch-strip mask-clean. See FIG. 10.

Each of these cleaning and etch-back processes will now be described in detail. Suitable wet chemistry cleaning processes for contamination removal include, but are not limited to, hydrochloric acid (HCl), hydrochloric acid:hydrogen peroxide:water (HCl:$H_2O_2$:$H_2O$), ammonium hydroxide:hydrogen peroxide:water ($NH_4OH$:$H_2O_2$:$H_2O$), and/or an organic solvent. HCl, as well as the acid-peroxide combination in HCl:$H_2O_2$:$H_2O$, is well suited to remove ionic contaminants, such as metals, from the first dielectric. The base-peroxide combination in $NH_4OH$:$H_2O_2$:$H_2O$ is well suited to removal of organic contaminants from the first dielectric, and so are some organic solvents. Any of these wet cleans can be used alone or in combination. For instance, a multi-step clean can include first a treatment with $NH_4OH$:$H_2O_2$:$H_2O$ to remove organic components, followed by a clean in HCl:$H_2O_2$:$H_2O$ to remove ionic species from the first dielectric. In situations where no etch-back of the first dielectric is desired, the cleaning process has to be compatible with this requirement. For example, organic contamination removal from an $Al_2O_3$ surface without etch-back cannot be performed with $NH_4OH$:$H_2O_2$:$H_2O$, as this solution is an efficient $Al_2O_3$ etchant. Instead, for example, a suitable organic solvent can be employed. See, for example, U.S. Patent Application Publication Number 2010/0018550 by Schwartzkopf et al., entitled "Cleaning Compositions with Very Low Dielectric Etch Rates," the contents of which are incorporated by reference as if fully set forth herein.

Suitable wet chemistry etch-back processes include, but are not limited to, hydrofluoric acid (HF), buffered oxide etch (BOE), $NH_4OH$:$H_2O_2$:$H_2O$ and/or $HaH_2O_2$:$H_2O$. HF and BOE are both efficient etchants for etching oxide substrates such as, for example, $SiO_2$ or $Al_2O_3$. They also efficiently etch non-crystalline $HfO_2$, while etch rates for crystallized $HfO_2$ tend to be low. Therefore, integration schemes that ensure a low degree of crystallinity at the time of the etch-back may be preferred. This can be achieved, for example, but employing atomic layer deposition (ALD)-grown $HfO_2$ that has not been exposed to temperatures in excess of 400° C. $NH_4OH$:$H_2O_2$:$H_2O$ is an efficient etchant for etching $Al_2O_3$.

Suitable dry cleaning processes include, but are not limited to, gas-phase and plasma cleaning with hydrogen gas ($H_2$), atomic hydrogen (H), hydrogen plasma, forming gas (FG), atomic oxygen (O), atomic nitrogen (N), and/or ozone ($O_3$). Plasma cleaning involves using high energy ionized plasmas from these gaseous species, as opposed to their (non-plasma, low energy) normal gas-phase states.

As noted above, multiple steps of methodology 100 can be carried out in-situ. For example, a gas-phase or plasma clean can be carried out in situ with a gas-phase or plasma clean etch-back and/or deposition of the second dielectric (see step 106—described below). In-situ processing without air exposure after modification (cleaning and/or etch-back) of the first dielectric minimizes further contamination of the dielectric surfaces.

Gas-phase and plasma etch-back can also be performed with, e.g., HF, hydrogen bromide (HBr), tetrafluoromethane ($CF_4$), trifluoromethane ($CHF_3$), chlorine ($Cl_2$)/HBr/oxygen ($O_2$) and mixtures of these with other gases or plasmas. As provided above, the process has to be chosen such that damage to the CNT is minimized. According to an exemplary embodiment, the goal of the etch-back process is to remove some of the first dielectric beneath the CNT(s) such that a recess is formed in the first dielectric beneath a center portion of the CNT(s), and opposite ends of the CNT(s) rest on the first dielectric to either side of the recess. Thus, the CNT(s) are essentially suspended over the recess. When the second dielectric is deposited onto the first dielectric and surrounding the CNT(s) in the recess (see below), the second dielectric in the recess interfaces with the first dielectric at a distance away from the CNT(s). To enable selective recessing of the first dielectric beneath the CNT(s), a mask is preferably employed during the etch-back process through which only a select region of the CNT(s)/first dielectric is exposed. Following etch-back, the mask can be removed.

Cleaning of the first dielectric can also be carried out using an anneal in an inert environment. By way of example only, an anneal at a temperature of from about 100° C. to about 500° C., and ranges therebetween, in an inert gas such as nitrogen ($N_2$), argon (Ar), and/or helium (He) effectively desorbs contaminants from the first dielectric.

Next, in step 106, a second dielectric is deposited onto the first dielectric and surrounding the CNT(s). When the first dielectric is recessed, the second dielectric can fully surround the CNT(s). As provided above, suitable dielectrics for the second dielectric include, but are not limited to, $SiO_2$, $Si_3N_4$, $Al_2O_3$, $HfO_2$, $ZrO_2$, $TiO_2$, $La_2O_3$, and combinations thereof. The first and second dielectrics can be the same material, or they can be different. Preferably, deposition of the second dielectric is performed in-situ, without air exposure after modification of the first dielectric (step 104)—see above. In-situ cleaning/etch-back and second dielectric deposition minimizes further contamination of the dielectric surfaces.

According to an exemplary embodiment, the second dielectric is deposited using atomic layer deposition (ALD), plasma-enhanced ALD, chemical vapor deposition (CVD), sputtering, or chemical solution deposition. ALD can be desirable because it generally provides better film conformality on non-planar structures than, e.g., a sputtering process.

Figure 2:
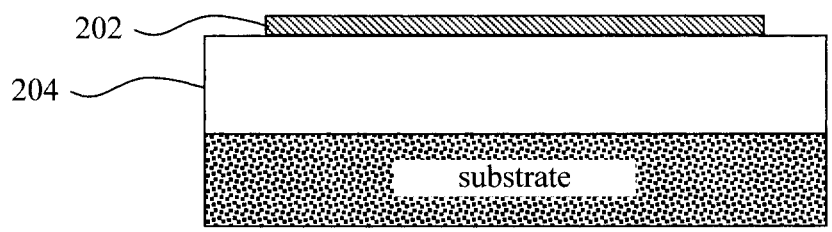
FIG. 2 is a cross-sectional diagram illustrating at least one CNT having been deposited onto a first dielectric film according to an embodiment of the present invention.

An exemplary embodiment employing methodology 100 to form a CNT-based device is now described by way of reference to FIGS. 2-9. As shown in FIG. 2, the process begins (as per step 102 of methodology 100) with at least one CNT 202 being deposited onto a first dielectric film 204 that is present on a substrate. Suitable substrates include, but are not limited to, semiconductor (e.g., silicon (Si), germanium (Ge), silicon germanium (SiGe) substrates), metal foil, plastic substrates, etc. If conductive, the substrate can serve as a back contact of the device. For instance, a metal foil or doped semiconductor substrate can also serve a back gate electrode. With a back-gated device configuration, the first dielectric 204 serves as the gate dielectric.

As described above, suitable dielectrics for the first dielectric include, but are not limited to, $SiO_2$, $Si_3N_4$, $Al_2O_3$, $HfO_2$, $ZrO_2$, $TiO_2$, $La_2O_3$, and combinations thereof. As described above, the CNT(s) 202 can be doped, e.g., either in solution or in situ, and can be deposited onto the first dielectric 204 using a suitable casting process, such as spin-on casting. Mechanisms for regulating the number of CNT(s) 202 deposited onto the first dielectric 204 were described above.

Figure 3:
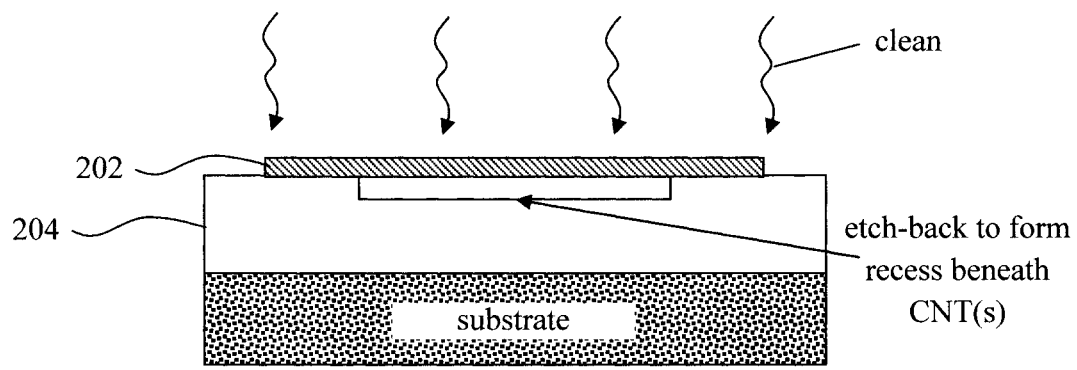
FIG. 3 is a cross-sectional diagram illustrating the first dielectric having been modified to remove contaminants from the first dielectric and to etch-back the first dielectric beneath a central portion of the CNT(s) according to an embodiment of the present invention.
Figure 3A:
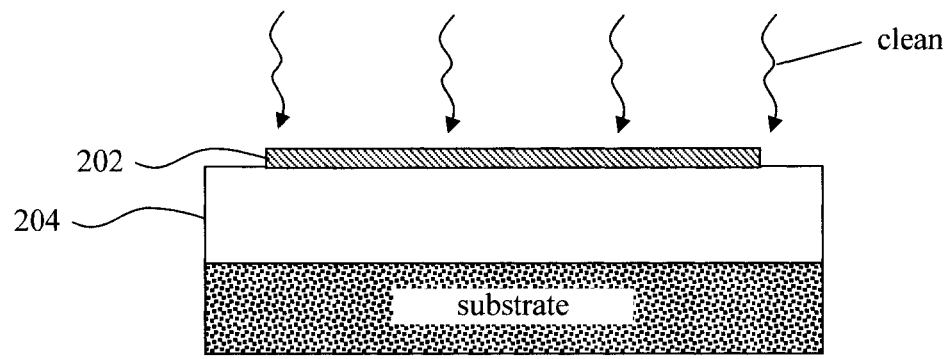
FIG. 3A is a cross-sectional diagram illustrating, according to an alternate embodiment, the first dielectric having been modified to remove contaminants from the first dielectric without etch-back according to an embodiment of the present invention.

Next, as shown in FIG. 3, the first dielectric 204 is modified (as per step 104 of methodology 100) during which the first dielectric 204 is i) cleaned to remove contaminants therefrom and, preferably, ii) etched-back beneath a (central) portion of the CNT(s). Suitable wet, dry, and annealing processes for cleaning/etching-back the first dielectric film were described above. It is notable that the cleaning and etch-back can be performed as distinct steps and, while optional, the etch back favorably places an interface of the first/second dielectrics remotely away from the CNTs (see below). However, embodiments are anticipated herein where a cleaning is performed (without etch back) to remove the contaminants from the first dielectric 204. See, for example, FIG. 3A.

As shown in FIG. 3, when etch-back is performed a recess is formed in the first dielectric 204 beneath a central portion of the CNT(s). Opposite ends of the CNT(s) rest on (the top surface/non-recessed portion of) the first dielectric to either side of the recess. Thus, the CNT(s) are suspended over the recess. When a second dielectric (see below) is deposited onto the first dielectric 204, the recess provides access to the entire circumference of the CNT(s). Therefore, the second dielectric fully surrounds the CNT(s). By comparison, in the case where the first dielectric 204 is not recessed, the CNT(s) rest on the first dielectric 204 (see, for example, FIG. 3A). Thus, the second dielectric can only partially surround the CNT(s) since it does not have full access around the CNT(s).

Figure 4:
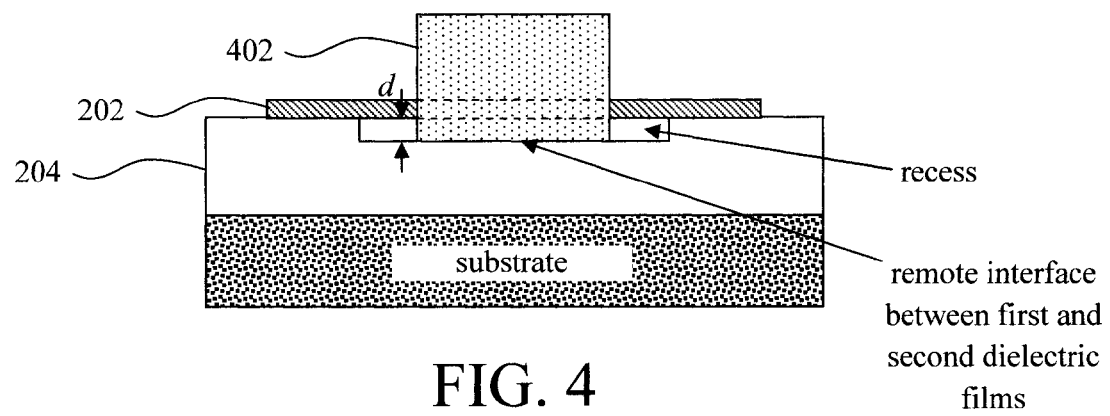
FIG. 4 is a cross-sectional diagram illustrating a second dielectric film having been deposited onto the first dielectric and fully surrounding the CNT(s) in the recess according to an embodiment of the present invention.

Next, as shown in FIG. 4, a second dielectric film 402 is deposited onto the first dielectric 204 and fully surrounding the CNT(s) 202 in the recess. As described above, suitable dielectrics for the second dielectric include, but are not limited to, $SiO_2$, $Si_3N_4$, $Al_2O_3$, $HfO_2$, $ZrO_2$, $TiO_2$, $La_2O_3$, and combinations thereof. Advantageously, as shown in FIG. 4, by recessing the first dielectric 204, the interface between the first dielectric 204 and the second dielectric 402 is remote (i.e., away from the CNT(s) 202). This configuration preferably places any stray charges and/or contaminants at the interface of the dielectrics away from the CNT(s). According to an exemplary embodiment, the interface between the first dielectric 204 and the second dielectric 402 is at a distance d away from the CNT(s) that is greater than or equal to about 1 nanometer (nm), e.g., from about 1 nm to about 5 nm, and ranges therebetween.

By comparison, when modifying the first dielectric 204 without an etch-back, the second dielectric 402a only partially surrounds the CNT(s) and interfaces with the first dielectric 204 adjacent to (immediately beneath) the CNT(s). See, for example, FIG. 4A.

Figure 4A:
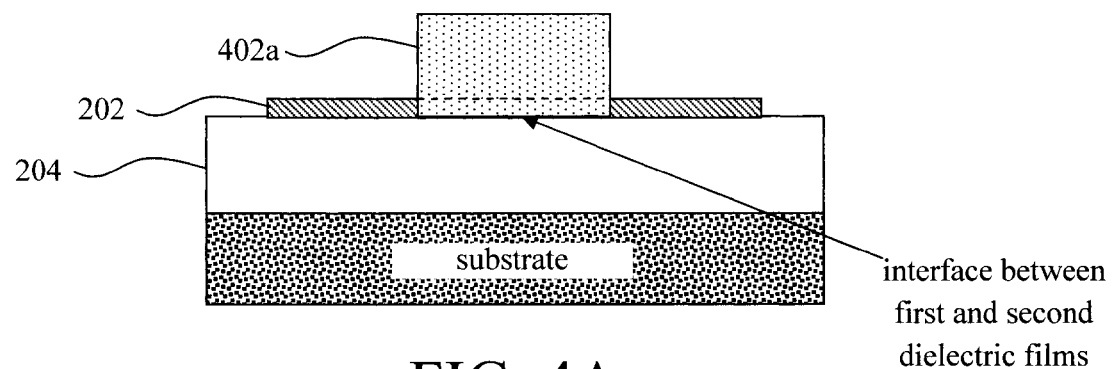
FIG. 4A is a cross-sectional diagram illustrating, according to the alternate embodiment, a second dielectric film having been deposited onto the first dielectric (without recess) and partially surrounding the CNT(s) according to an embodiment of the present invention.

As shown in FIGS. 4 and 4A, the second dielectric 402 can be patterned to surround/cover only a (central) portion of the CNT(s) 202, such that portions of the CNT(s) 202 extend out to either side of the second dielectric 402. When forming a device such as a CNT-based transistor, this is done to permit source and drain contacts, etc. to be formed. However, when forming other device structures such as interconnects, it may be desirable to cover the entire length of the CNT(s) 202 with the second dielectric 402. Standard lithography and etching techniques may be employed to pattern the second dielectric 402 from a blanket layer.

Figure 5:
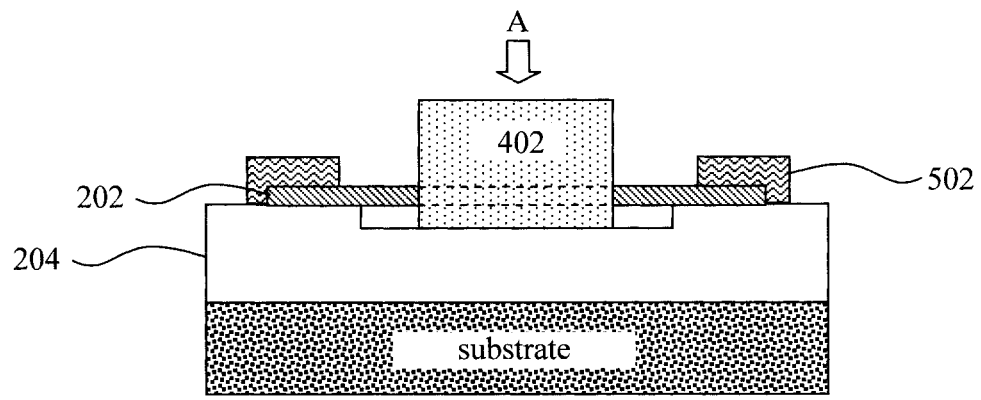
FIG. 5 is a cross-sectional diagram illustrating source and drain contacts having been formed on opposite ends of the CNT(s) according to an embodiment of the present invention.
Figure 6:
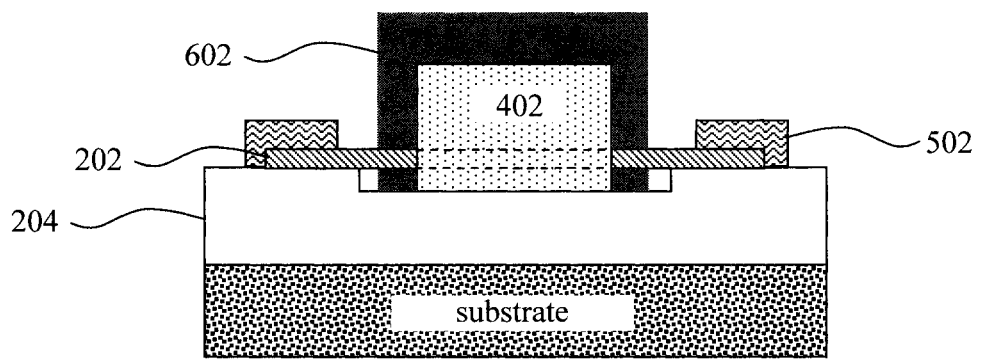
FIG. 6 is a cross-sectional diagram illustrating a gate having been formed over the CNT(s), separated from the CNT(s) by the second dielectric according to an embodiment of the present invention.

As provided above, by way of example only, the present techniques can be employed to fabricate a CNT-based transistor. For instance, as shown in FIG. 5, source and drain contacts 502 are formed on opposite ends of the CNT(s) 202. While FIG. 5 illustrates the process in the context of a recessed dielectric, the same steps for forming the transistor are performed regardless of whether or not an etch-back is performed. According to an exemplary embodiment, the source and drain contacts 502 are metal contacts formed on the CNT(s) 202 using a process such as evaporation or sputtering.

If, as provided above, the substrate is conductive and a back-gated device is being formed, then the transistor is now complete with a gate (substrate), CNT channel, and source and drain contacts. On the other hand, for a top gated device a gate 602 is next formed over the CNT(s) 202, separated from the CNT(s) 202 by the second dielectric 402. See FIG. 6. In that configuration, the second dielectric 402 serves as the gate dielectric. The gate 602 is formed from a conductor such as doped poly-silicon, a metal or metals, or combinations thereof.

Figure 7:
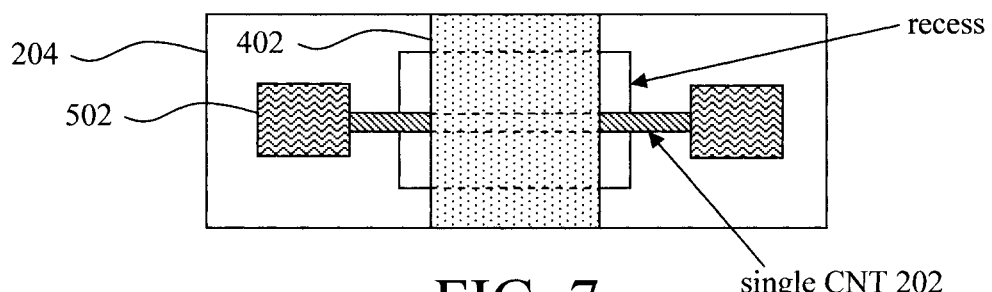
FIG. 7 is a top-down view of a single CNT device according to an embodiment of the present invention.
Figure 8:
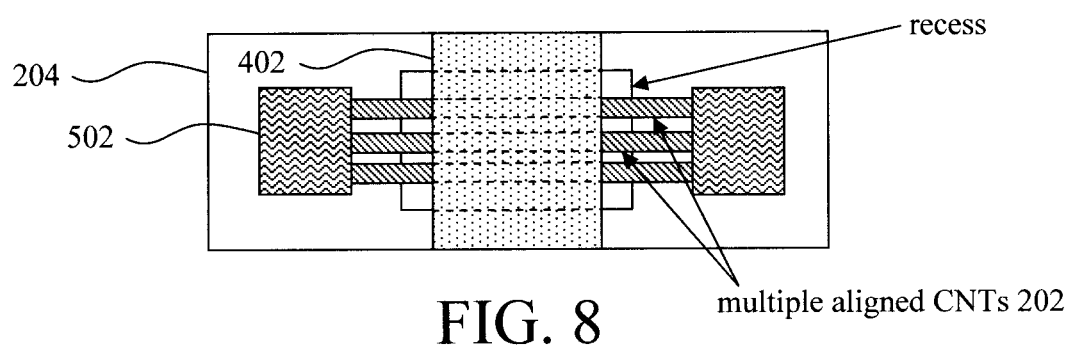
FIG. 8 is a top-down view of a multiple aligned CNT device according to an embodiment of the present invention.
Figure 9:
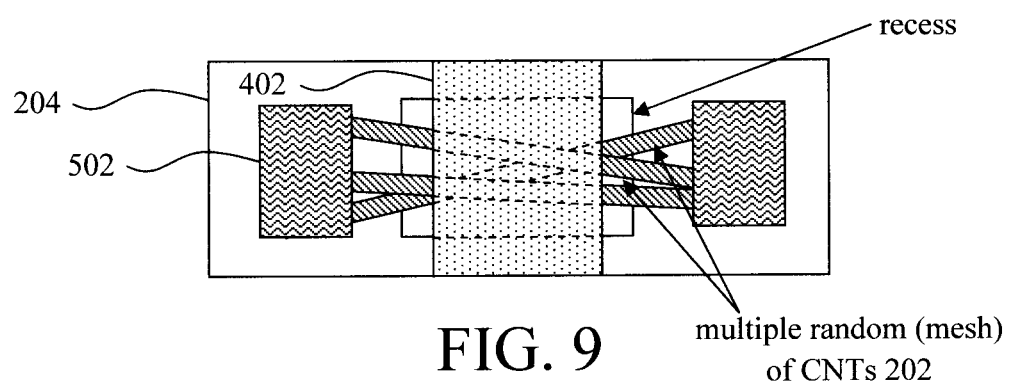
FIG. 9 is a top-down view of a multiple random CNT mesh device according to an embodiment of the present invention.

As provided above, embodiments are considered herein where CNT(s) 202 includes a single CNT, or alternatively where CNT(s) 202 includes multiple CNTs either as an ordered/aligned array, or as a random oriented mesh. A top view (e.g., from vantage point A in FIG. 5) of a single CNT device, a multiple aligned CNT device, and a multiple random CNT mesh device are shown in FIGS. 7, 8, and 9, respectively.

Figure 10:
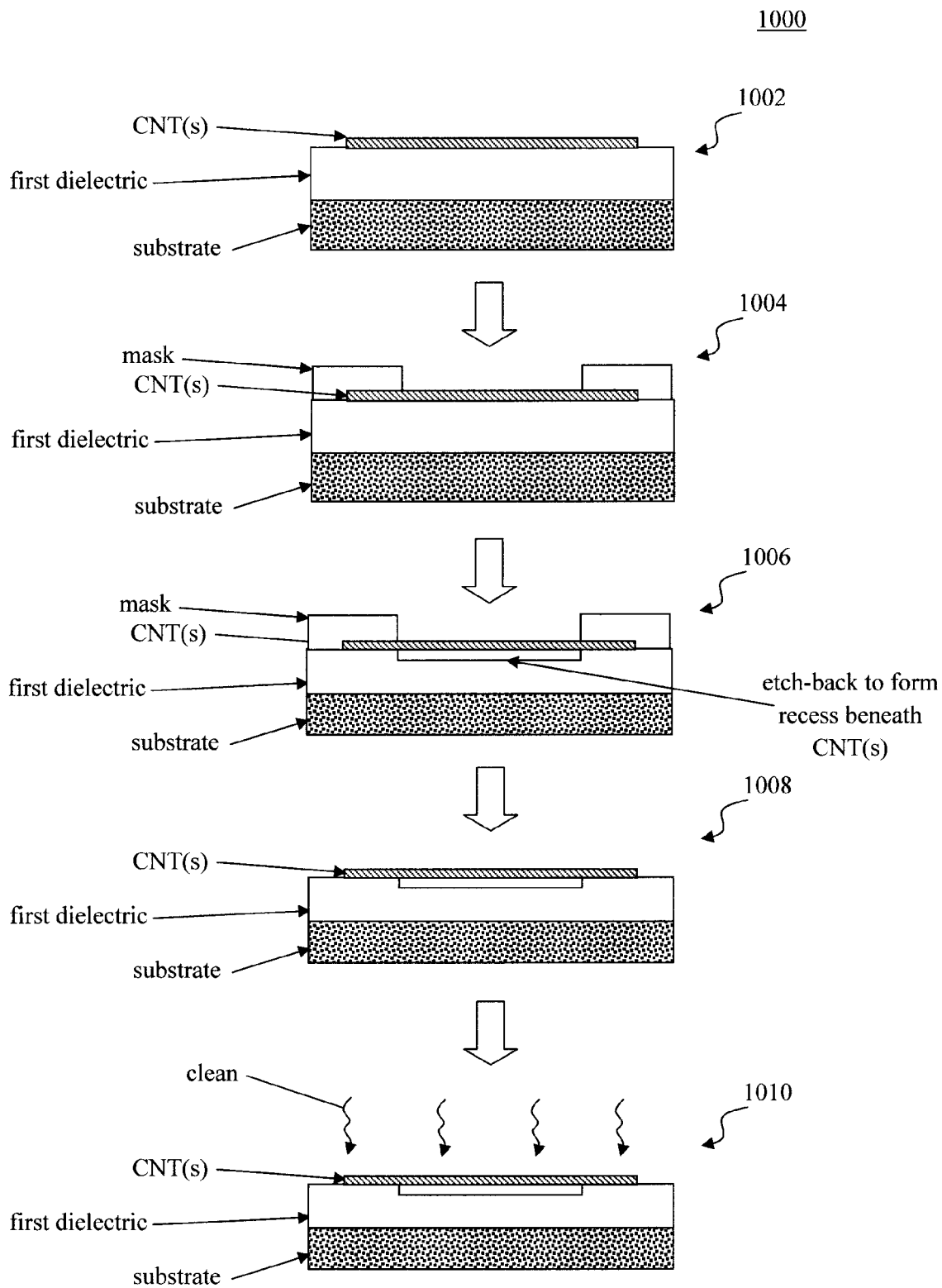
FIG. 10 is a diagram illustrating an exemplary methodology for surface clean and etch back of the first dielectric according to an embodiment of the present invention.

As described in conjunction with the description of step 104 of FIG. 1 above, when a surface cleaning and etch back of the first dielectric are both performed, the etch back is preferably done prior to the surface clean. See, for example, exemplary methodology 1000 shown in FIG. 10. As shown in FIG. 10, after the CNT(s) have been deposited, grown, etc. on the first dielectric (see step 1002), a mask is formed over the CNT(s). See step 1004. As shown in step 1004, the mask covers all but a central portion of the CNT(s) under which the first dielectric will be recessed. Specifically, as shown in step 1006, the above-described etch back is performed through the mask to recess the first dielectric beneath the CNT(s). As shown in step 1006, the recess is performed under a central portion of the CNT(s), leaving the ends of the CNT(s) in contact with the first dielectric to either side of the recess.

Following the recess etch, the mask is removed (see step 1008) and a surface clean is performed (see step 1010). The balance of the process can proceed in the same manner as described above, e.g., encapsulation with the second dielectric etc.

As provided above, one method contemplated herein for 'placing' the CNTs on the first dielectric is by in-situ growth of the CNTs. According to an exemplary embodiment, growth from a vertical surface is used to produce horizontally aligned CNTs on the first dielectric. See, for example, methodology 1100 of FIG. 11. As shown in step 1102, a vertical surface is created on the first dielectric. According to an exemplary embodiment, a silicon layer is deposited onto the first dielectric and, according to the process detailed in Lu, a trench is formed in the silicon layer. However, any vertical surface on which CNT growth can be nucleated would suffice. Next, as shown in step 1104, a catalyst is formed on the vertical surface. A suitable catalyst for CNT growth includes, but is not limited to, an iron catalyst. The catalyst is used to grow horizontally-aligned CNTs over the first dielectric (see step 1106) using, e.g., a standard thermal CVD process (see Lu). The vertical surface can then be removed. See step 1108.

The present techniques are further described by way of reference to the following non-limiting example:

Perform a 2-step clean where, in step 1 the target contaminants are particles, light organics, and some metals (e.g., cobalt (Co), copper (Cu), zinc (Zn), titanium (Ti), and/or tantalum (Ta)). Specifically, a wet clean is performed in step 1 using $NH_4OH:H_2O_2:H_2O=1:1:40$ at 30° C. for 5 minutes. Use of a lower temperature (i.e., 30° C. as opposed to 65° C.-80° C.) reduced bubbling and $H_2O_2$ decomposition while maintaining the same cleaning performance. This chemistry was found to etch $Al_2O_3$ but not $HfO_2$, and to slowly etch $SiO_2$.

In step 2, the target contaminants are metals (some of which are deposited from solution in step 1). Specifically, a wet clean is performed in step 2 using $HCl:H_2O_2:H_2O=1:1:5-1:1:50$ at 40-75° C. This chemistry was found to etch $Al_2O_3$ slowly, but not $HfO_2$ or $SiO_2$.

Alternatively, step 2 is performed to remove metals using $HCl:H_2O=1:100$ at 60° C. for 5 minutes. This chemistry was found not to etch $Al_2O_3$, $HfO_2$ or $SiO_2$.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for forming a carbon nanotube-based device, the method comprising:
   providing at least one carbon nanotube disposed on a top planar surface of a first dielectric with the at least one carbon nanotube along an entire length thereof being in direct physical contact with the top planar surface of the first dielectric;
   removing surface contaminants from the first dielectric; and
   depositing a second dielectric directly onto the first dielectric and at least partially surrounding the at least one carbon nanotube,
   wherein the removing of the surface contaminants from the first dielectric further comprises:
   etching back the first dielectric to form a recess in the first dielectric beneath a center portion of the at least one carbon nanotube whereby, following the etching back, the center portion of the at least one carbon nanotube is suspended over the recess, wherein the etching back is performed before the second dielectric is deposited such that the second dielectric fully surrounds the at least one carbon nanotube in the recess.

2. The method of claim 1, further comprising:
   depositing the at least one carbon nanotube onto the first dielectric.

3. The method of claim 1, further comprising:
   growing the at least one carbon nanotube on the first dielectric.

4. The method of claim 1, wherein the first dielectric is selected from the group consisting of: silicon oxide, silicon nitride, aluminum oxide, hafnium oxide, zirconium oxide, titanium oxide, lanthanum oxide, and combinations thereof.

5. The method of claim 1, wherein the first dielectric is disposed on a substrate.

6. The method of claim 5, wherein the substrate is electrically conductive and serves as a back gate of the carbon nanotube-based device, and wherein the first dielectric serves as a gate dielectric that separates the back gate of the device from the at least one carbon nanotube.

7. The method of claim 1, wherein multiple carbon nanotubes are disposed on the first dielectric, and wherein the multiple carbon nanotubes comprise an aligned array.

8. The method of claim 1, wherein multiple carbon nanotubes are disposed on the first dielectric, and wherein the multiple carbon nanotubes comprise a randomly oriented mesh.

9. The method of claim 1, wherein the surface contaminants are removed from the first dielectric using a wet cleaning process.

10. The method of claim 9, wherein the wet cleaning process is selected from the group consisting of: hydrochloric acid (HCl), hydrochloric acid:water ($HCl:H_2O$), hydrochloric acid:hydrogen peroxide:water ($HCl:H_2O_2:H_2O$), ammonium hydroxide:hydrogen peroxide:water ($NH_4OH:H_2O_2:H_2O$), and combinations thereof.

11. The method of claim 1, wherein the surface contaminants are removed from the first dielectric using a dry cleaning process.

12. The method of claim 11, wherein the dry cleaning process is selected from the group consisting of: gas-phase cleaning and plasma cleaning.

13. The method of claim 1, wherein the surface contaminants are removed from the first dielectric by annealing in an inert environment to desorb the contaminants from the first dielectric.

14. The method of claim 1, wherein the second dielectric is selected from the group consisting of: silicon oxide, silicon nitride, aluminum oxide, hafnium oxide, zirconium oxide, titanium oxide, lanthanum oxide, and combinations thereof.

15. The method of claim 1, wherein the removing of the surface contaminants and the depositing of the second dielectric are performed in-situ.

16. The method of claim 1, wherein an interface between the first dielectric and the second dielectric in the recess is separated from the at least one carbon nanotube by a distance d of from about 1 nanometer to about 5 nanometers, and ranges therebetween.

17. The method of claim 1, wherein the removing of the surface contaminants, the etching back of the first dielectric, and the depositing of the second dielectric are performed in-situ.

18. The method of claim 1, further comprising:
    forming source and drain contacts to the at least one carbon nanotube.

19. The method of claim 1, further comprising:
    forming a gate over the at least one carbon nanotube, wherein the second dielectric serves as a gate dielectric that separates the gate from the at least one carbon nanotube.

20. A carbon nanotube-based device, comprising:
    a first dielectric;
    at least one carbon nanotube disposed on the first dielectric;
    a recess in the first dielectric beneath a center portion of the at least one carbon nanotube whereby at least one part of the center portion of the at least one carbon nanotube is suspended over the recess; and a second dielectric disposed on the first dielectric, wherein the second dielectric fully surrounds the at least one carbon nanotube in the recess, and wherein an interface between the first dielectric and the second dielectric, which is present at a bottom of the recess, is separated from the at least one carbon nanotube by a distance d of from about 1 nanometer to about 5 nanometers, and ranges therebetween.

* * * * *